United States Patent
Sorensen

(10) Patent No.: US 8,525,512 B2
(45) Date of Patent: Sep. 3, 2013

(54) FARADAY OPTICAL CURRENT SENSOR ARRANGEMENT

(75) Inventor: Freddy Sorensen, Birkerod (DK)

(73) Assignee: Powersense A/S, Holte (DK)

( * ) Notice: Subject to any disclaimer, the term of this patent is extended or adjusted under 35 U.S.C. 154(b) by 404 days.

(21) Appl. No.: 12/994,436
(22) PCT Filed: May 29, 2009
(86) PCT No.: PCT/DK2009/000123
§ 371 (c)(1),
(2), (4) Date: Nov. 23, 2010
(87) PCT Pub. No.: WO2009/143851
PCT Pub. Date: Dec. 3, 2009

(65) Prior Publication Data
US 2011/0062944 A1 Mar. 17, 2011

Related U.S. Application Data

(60) Provisional application No. 61/057,974, filed on Jun. 2, 2008.

(30) Foreign Application Priority Data

May 30, 2008 (EP) .................................... 08388018

(51) Int. Cl.
*G01R 31/00* (2006.01)
(52) U.S. Cl.
USPC .......................................................... 324/96
(58) Field of Classification Search
USPC ............... 324/96, 97, 762.01–762.1; 257/48; 438/14–18
See application file for complete search history.

(56) References Cited

U.S. PATENT DOCUMENTS

| | | | |
|---|---|---|---|
| 4,650,971 A | 3/1987 | Manecci et al. | |
| 5,057,769 A | 10/1991 | Edwards | |
| 5,128,608 A * | 7/1992 | Ochi | 324/96 |
| 8,076,925 B2 * | 12/2011 | Harlev et al. | 324/97 |
| 2003/0146748 A1 | 8/2003 | Duncan et al. | |

FOREIGN PATENT DOCUMENTS

| | | |
|---|---|---|
| JP | 1305365 | 12/1989 |
| JP | 4161860 | 6/1992 |
| JP | 9257838 | 10/1997 |
| WO | WO2004/099798 | 11/2004 |

OTHER PUBLICATIONS

International Search Report on related PCT application (PCT/DK2009/000123); International Searching Authority (EPO) dated Jul. 20, 2009.
Written Opinion on related PCT application (PCT/DK2009/000123); International Searching Authority (EPO) dated Jul. 20, 2009.

* cited by examiner

*Primary Examiner* — Tung X Nguyen
(74) *Attorney, Agent, or Firm* — Klein, O'Neill & Singh, LLP

(57) ABSTRACT

A Faraday optical current sensor arrangement for measuring the current through a power line comprises a Faraday optical current sensor (38) having an elongated and substantially cylindrical shape defining a first end and a second end opposite the first end. The Faraday optical current sensor has a first optical conduit (48) extending from the first end and a second optical conduit (48) extending from the second end. Furthermore, the Faraday optical current sensor arrangement comprises a hollow housing (12,14) enveloping the Faraday optical current sensor and fixating the Faraday optical current sensor in a specific measurement position relative to the hollow housing. The hollow housing defines a channel for accommodating the Faraday optical current sensor and the first and second optical conduits and an opening (15) for communicating with the channel. The hollow housing includes a holder (16) for fixating the power line and the hollow housing relative to one another in a juxtaposed position and positioning the Faraday optical current sensor in a specific measuring position relative to the power line.

8 Claims, 6 Drawing Sheets

FARADAY OPTICAL CURRENT SENSOR ARRANGEMENT

CROSS-REFERENCE TO RELATED APPLICATION

This application is a national phase filing, under 35 U.S.C. §371(c), of International Application No. PCT/DK2009/000123, filed May 29, 2009, and it claims priority, under 35 U.S.C. §119(e), from US Provisional Patent Application Ser. No. 61/057,974, filed on Jun. 2, 2008, the disclosure of which is incorporated herein by reference irk its entirety.

FEDERALLY SPONSORED RESEARCH OR DEVELOPMENT

Not Applicable

BACKGROUND OF THE INVENTION

Faraday optical current sensors may be used for measuring a current in a nearby power line. Faraday optical current sensors rely on the Faraday effect. The Faraday effect states that the rotation of a polarized light beam is proportional to the magnetic field component in the direction of the beam. A charge moving inside a conductor will produce a circular magnetic field around the conductor. Thus, by placing an optical Faraday optical current sensor parallel to the direction of the magnetic field lines the magnitude of the current may be measured.

Using a Faraday optical current sensor provides many advantages compared to conventional technologies such as current transformers. One of the most important advantages is the fact that the Faraday optical current sensor may be constructed entirely from dielectric materials. This is especially important for high voltage/high current applications and gives the Faraday optical current sensor substantial immunity against electromagnetic disturbances. Another important advantage of Faraday optical current sensors is that they may be galvanic separated from the power line and they do not influence the current in the power line in any way. This almost eliminates the risk of a short circuit of the power line thought the measurement system. One example of such a Faraday optical current sensor is the DISCOS® Opti module produced by the applicant company and described in U.S. Pat. No. 7,068,025, to which reference is made and which is hereby incorporated in the present specification by reference.

A Faraday optical current sensor comprises a magneto-optical part typically formed as a rod, fibre or similar made of a material exhibiting a high Faraday effect. This typically means a material having a high Verdet constant. The Verdet constant is the proportionality constant of the Faraday effect. The angle of rotation of the polarized light may be described by the following formula:

$$\beta = V \times B \times d$$

where β is the angle of rotation, d is the length of the path where magnetic field and light interact, B is the magnetic flux density in the direction of light propagation and V is the Verdet constant. The magnetic flux density at a certain location outside a conductor may be calculated by using the well-known formula:

$$B = \frac{\mu_0 I}{2\pi r}$$

where B is the magnetic flux density, $\mu_0$ is the magnetic constant, I is the current and r is the distance from the conductor.

The magneto-optical part may be supplied with polarized light from a light source such as a lamp or LED emitting linear polarized light in a specific wavelength. The light source may comprise a polarized filter for generating light with a specific linear polarisation. The light exiting the magneto-optical part may be detected and preferably converted to an electrical signal by a detection unit. The detection unit detects the rotation of the polarized light exiting the magneto-optical part. A control unit may evaluate the signal from the detection unit, perform the necessary error corrections and calculations to determine the current in the power line. Possible sources of errors include sensor position in relation to the power line, optical noise, transition effects when light enters and exits different optical media and temperature effects. The Faraday optical current sensor is preferably calibrated before use, e.g. by using standard current measurement equipment. Standard current measurement equipment may comprise e.g. a current transformer. After calibration the Faraday optical current sensor may replace e.g. a current transformer for monitoring currents and report the measured values to a control system. The Faraday optical current sensor may also be used to detect fault currents such as short circuit currents and report such occurrences to a safety system, which may in turn activate the relevant circuit breakers and backup systems to avoid damage to other equipment in the power distribution grid.

The magneto optical part and the light source and the detection unit are preferably connected via an optical conduit such as an optical fibre. Optical fibres provide a substantial amount of flexibility and allow light to travel long distances without considerable losses in light intensity. However, it is important to be aware of the limits in flexibility of optical fibres. Optical fibres may fail due to being broken, damaged or deformed if they are bent beyond a flexibility limit. A failure in the optical fibre due to excessive bending will typically permanently make them unusable for conducting light. Typical optical fibres may be bent considerably less than electrical cables.

Since optical sensors may be constructed by using dielectric materials only the sensors may be positioned in locations where other sensors, i.e. sensors comprising conductive materials, are not suitable. Such locations include places subject to high electrical fields, which are common in the field of high current and high voltage engineering. Additionally, the Faraday optical current sensors are very compact and light since they do not contain any metal parts. The magneto-optical part for high voltage and high current applications may be made having dimensions in the mm range. For better handling and protection, the magneto-optical part as well as the junctions with the optical conduits are encapsulated by a small cylindrical housing. All of the above features of the optical Faraday optical current sensors make a broad range of new measurement positions feasible.

New measurement positions require suitable fixation equipment for fixating the Faraday optical current sensor to the power line. In many cases the current measurement equipment constitutes a separate unit in e.g. a substation. Having a separate current measurement unit requires a considerable amount of space and material. However, using the Faraday optical current sensor a separate current measurement unit is not necessary. Due to the small size and dielectric properties of the Faraday optical current sensor it may also be combined with any other high voltage or high current equipment.

Due to the large influence of the measurement position on the measurement results it is important that the measurement position is clearly defined and determined. Also, the measurement position should be protected from tampering and involuntary disturbances.

For outdoor applications such as overhead lines the Faraday optical current sensor should be firmly fixated in the measurement position and at the same time protected against any influence from the nature. For indoor applications such as inside a substation the Faraday optical current sensor should be at least firmly fastened in the measurement position.

SUMMARY OF THE INVENTION

It is therefore an object according to the present invention to provide a method and a system for fixating a Faraday optical current sensor in a suitable measurement position for measuring the current in a nearby power line.

The above need and the above object together with numerous other objects and features will be evident from the below detailed description of a first and presently preferred embodiment of an system according to a first aspect of the present invention of a Faraday optical current sensor arrangement for measuring the current through a power line, said arrangement comprising a Faraday optical current sensor having an elongated and substantially cylindrical shape, defining a first end and a second end opposite said first end, said Faraday optical current sensor having a first optical conduit extending from said first end and a second optical conduit extending from said second end, and a hollow housing enveloping said Faraday optical current sensor and fixating said Faraday optical current sensor in a specific position relative to said hollow housing, said hollow housing defining a channel for accommodating said Faraday optical current sensor and said first and second optical conduits and an opening for communicating with said channel, said hollow housing including a holder for fixating said power line and said hollow housing relative to one another in a juxtaposed position and positioning said Faraday optical current sensor in a specific measuring position relative to said power line.

Once the system is calibrated, the measurement position must be kept unchanged in relation to the power line for a correct measurement result. If the position of the Faraday optical current sensor is not firmly fixated, influences from the environment may cause the Faraday optical current sensor to shift its position. Since the magnetic flux density is inversely proportional to the distance from the power line, a shift of the Faraday optical current sensor in the radial direction of the power line will yield a lesser magnetic field for the same current, and thereby result in a measurement error. Additionally, since the rotation of the polarisation of the light is proportional to the magnetic flux density in the direction of the Faraday optical current sensor, a change in the direction of the Faraday optical current sensor will yield a measurement error.

From the above it is evident that the Faraday optical current sensor must be placed in a defined measurement position and fixated in the measurement position permanently. Any undefined fixation will without doubt lead to changes in the position of the Faraday optical current sensor over time and thus measurement errors. Using the above Faraday optical current sensor arrangement the Faraday optical current sensor is securely fixated in a suitable measurement position and protected from any involuntary influence from the outside environment.

By providing the housing of the first embodiment of the system according to the first aspect of the present invention, the measurement position of the Faraday optical current sensor arrangement, and thereby the magneto-optical part, may be secured. The housing also protects the Faraday optical current sensor from any natural hazards present in an outdoor environment. Such natural hazards may be e.g. rain, snow, ice, dust, sand, sunlight storms, blizzards or wild animals such as birds or insects. In an indoor industrial environment the housing may protect the Faraday optical current sensor from pollutants such as dust particles, which may otherwise enter the Faraday optical current sensor. The housing and the Faraday optical current sensor should be made of a substantially magnetically transparent material, such as a diamagnetic material like plastic or copper, or alternatively a paramagnetic material such as aluminium. Using a ferromagnetic material such as iron or many steels will shield the magnetic field and make Faraday optical current measurements impossible. The housing and the Faraday optical current sensor may preferably also be made of electrically transparent material, i.e. dielectric material. By using dielectric material the housing may be used as an insulator and the risk of a fault current propagating from the power line through the Faraday optical current sensor and its equipment is almost eliminated. Materials being both electrically transparent and magnetically transparent include most plastics, rubber ceramics and glass.

According to a second embodiment of the Faraday optical current sensor arrangement according to the first aspect of the present invention for measuring the current through a power line, said arrangement may further comprise a hollow housing comprising a hollow base part defining an inner space and a hollow loop-shaped part, said base part defining said opening for accessing said inner space of said base part, said hollow loop-shaped part defining said channel having a primary end and a secondary end both communicating with said opening via said inner space of said base part.

Since the optical conduit typically comprising an optical fibre may only be bent to a certain limited extent, the housing must necessarily include a loop arrangement for accommodating the optical conduit entering and leaving the Faraday optical current sensor. Therefore the simplest and most efficient configuration of the housing in relation to material usage has a loop shape. By shaping the housing as a loop the Faraday optical current sensor may be sufficiently protected inside the loop and at the same time the optical conduit is accommodated, protected and guided in a way not bending it more than allowed to avoid failure.

The above embodiment of the Faraday optical current sensor arrangement according to the first aspect of the present invention also efficiently combines a Faraday optical current sensor and a holder for the power line. The Faraday optical current sensor arrangement may consequently be used to fixate the power line as an overhead line. The current may thus be measured directly on the overhead line in a measurement position not feasible by using standard current measurement systems.

According to a further embodiment of the system according to the first aspect of the Faraday optical current sensor arrangement according to the first aspect of the present invention for measuring the current through a power line, the arrangement may further comprise a fastener for fastening said housing to a hollow insulator.

The Faraday optical current sensor arrangement may further be used to support the weight of the power line. For this purpose a fastener may be used to fasten the Faraday optical current sensor arrangement to an insulator. The fastener may e.g. comprise a joint or winding for accommodating the Faraday optical current sensor arrangement onto the insulator. The small extra weight of the Faraday optical current sensor makes any separate support mechanism unnecessary. In this way the Faraday optical current sensor may be integrated into an already present support system, such as a tower for carrying an overhead line. The insulator is preferably hollow to allow the optical conduit to be protected inside the insulator and avoid any fault current to propagate on the optical conduit. Despite being of dielectric material, conductive dirt and dust particles may collect on the optical conduit making it conductive. This is avoided if the optical conduit is protected inside the insulator.

According to a further embodiment of the Faraday optical current sensor arrangement according to the first aspect of the present invention, said arrangement may further include a screw holder and/or a snap holder.

Using a screw holder and/or snap holder to fixate the power line will provide a secure fixation and avoid any involuntary release of the power line. It will also secure the measurement position in relation to the power line. At the same time a screw holder and/or snap holder provides a quick assembly and disassembly of the Faraday optical current sensor arrangement.

The present invention further relates to a method for assembling a Faraday optical current sensor arrangement for measuring the current through a power line, said method comprising:
providing a Faraday optical current sensor having an elongated and substantially cylindrical shape, defining a first end and a second end opposite said first end, said Faraday optical current sensor having a first optical conduit extending from said first end and a second optical conduit extending from said second end, and
providing a hollow housing enveloping said Faraday optical current sensor, said hollow housing defining a channel and an opening for communicating with said channel, said hollow housing including a holder, and by performing the following steps:
accommodating said Faraday optical current sensor and said first and second optical conduits in said channel,
fixating said Faraday optical current sensor in a specific measurement position relative to said hollow housing,
fixating said power line and said hollow housing in said holder relative to one another in a juxtaposed position such that said Faraday optical current sensor is positioned in a specific measuring position relative to said power line.

The Faraday optical current sensor should be fixated in a defined, reliable and secure way to avoid the Faraday optical current sensor being disturbed. The method above is preferably used to assemble a Faraday optical current sensor arrangement primarily for outdoor applications as previously described. The method may be used for installing a new Faraday optical current sensor in a power system or alternatively be provided as an accessory to already present power system. The housing may further be used only to accommodate the Faraday optical current sensor or alternatively to fixate the power line to an insulator or the like. The Faraday optical current sensor requires only minimum maintenance and must not be recalibrated unless being disturbed in relation to its measurement position.

The present invention further relates to a method for assembling a Faraday optical current sensor arrangement for measuring the current through a power line, said method comprising
providing a Faraday optical current sensor having an elongated and substantially cylindrical shape, defining a first end and a second end opposite said first end, said Faraday optical current sensor having a first optical conduit extending from said first end and a second optical conduit extending from said second end, and
providing a frame or alternatively a plate comprising a first holder and a second holder, said frame or plate defining a fixation hole by performing the following steps:
fixating said Faraday optical current sensor in a specific measurement position relative to said frame or plate by using said first holder,
fixating said first and second optical conduit to said frame or plate by using said second holder,
fixating said power line and said hollow housing in said holder relative to one another in a juxtaposed position such that said Faraday optical current sensor is positioned in a specific measuring position relative to said power line by using said fixation hole.

For indoor applications not subject to any natural hazards or pollutions the housing is not required and may be substituted by a simpler form of fixation. Such locations may e.g. be inside a substation or transformer station. For this purpose the Faraday optical current sensor need not be completely encapsulated; a plate or frame will suffice. The requirement of a secure fixation still applies; therefore the Faraday optical current sensor must be securely fixed onto the plate/frame and the plate/frame must be securely fixed onto the power line. The power line in such cases typically comprises a bus bar or a cable.

To protect the optical conduits they are preferably inserted into a more rigid tube for added protection. The tube may be fixated to the plate/frame. The plate frame should be made of rigid and magnetically transparent material.

The present invention further relates to a method of measuring a current by providing a Faraday optical current sensor arrangement according to any of the previously described arrangements and performing the following steps:
Irradiating said first optical conduit with light having a specific wavelength and a specific first polarization; and
determining a second polarization of the light exiting said second conduit and calculating a current in said power line by using the rotational difference between said first polarization and said second polarization.

The measurement method above involves using the previously described measurement assemblies to perform Faraday optical current measurements. A commercial available sensor system comprising a Faraday optical current sensor, optical conduit, detector and light source may be used. The sensor system should be properly calibrated before producing reliable data.

It is evident that numerous variations of the systems and methods described above may be realized.

BRIEF DESCRIPTION OF THE DRAWINGS

The invention is now to be further described with reference to the drawings, in which.

DETAILED DESCRIPTION OF THE INVENTION

Figure 1:
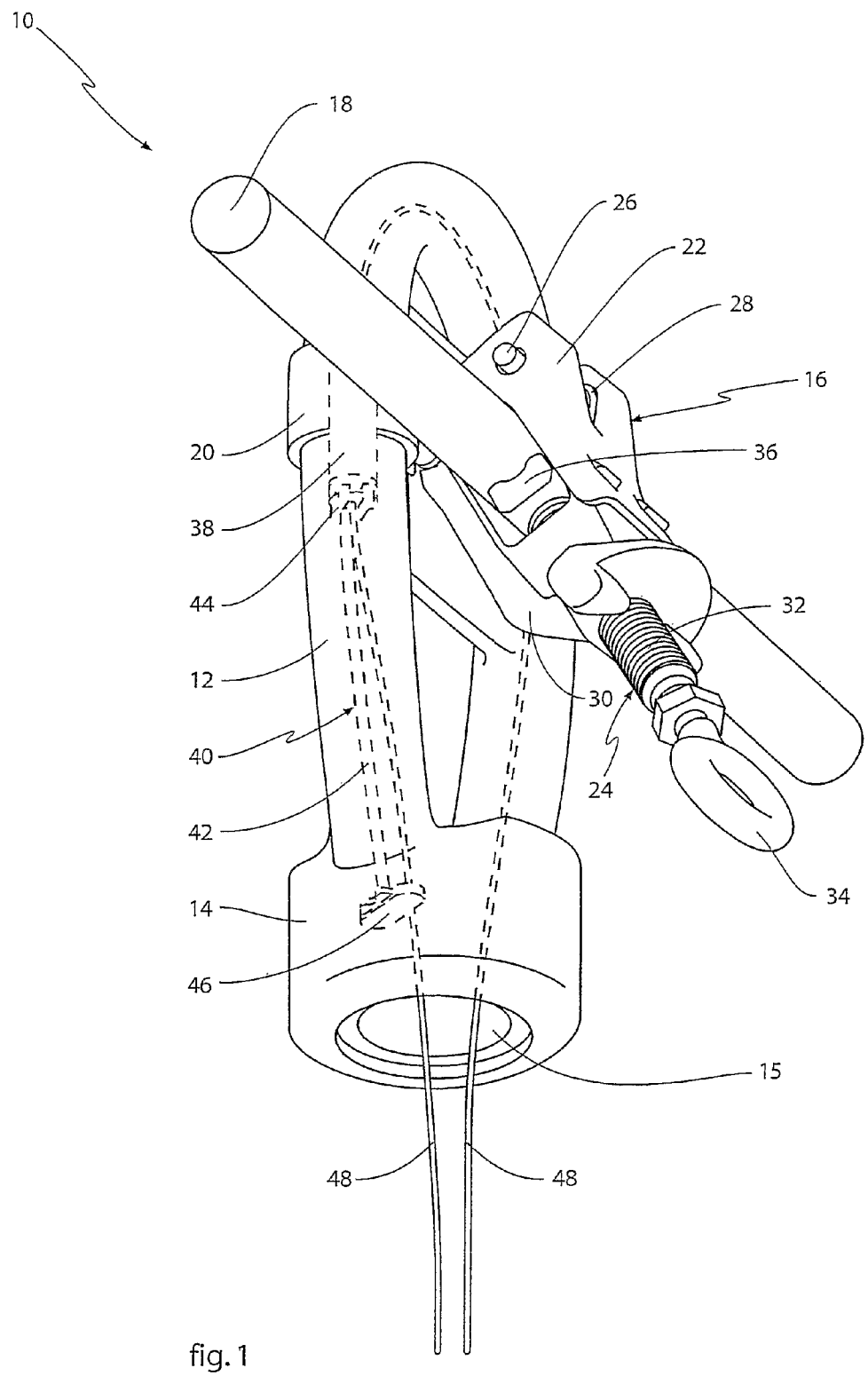
FIG. 1 is an overall perspective and schematic view of a first and presently preferred embodiment of a current measurement system according to the present invention.

FIG. 1 shows a perspective view of a first and presently preferred embodiment of a current measurement system 10 according to the present invention. The current measurement system 10 comprises a hollow loop 12, a hollow cylindrical base 14 attached to the hollow loop 12 and a power line holder 16 attached to the hollow loop 12. The above parts are preferably welded together. The hollow cylindrical base 14 has a circular opening 15 for accessing the inner space defined by the hollow cylindrical base 14 and the hollow loop 12. The hollow loop is attached to the hollow cylindrical base 14 on the opposite closed side in relation to the circular opening 15. The power line holder 16 may be used to fixate the current measurement system to a power line 18 in a flexible way. The power line 18 comprises an elongated wire or a set of wires having a diameter of approximately 10 mm. For normal air insulated overhead applications, the power line 18 does not have any insulating coating. The power line 18 may also comprise a set of thinner wires bundled together. The power line 18 is made of a metal having excellent current conducting capabilities, typically aluminium, alternatively copper. A spacer 20 made of soft material such as plastic or rubber may be used to avoid a direct contact between the hollow loop 12 and the power line 18. The hollow loop 12, the hollow cylindrical base 14 and the power line holder 16 are preferably made of a magnetically transparent material with sufficient rigidity to withstand many years of outdoors usage. Such material may be e.g. aluminium.

The power line holder 16 is attached on the outer wall of the hollow loop 12. The power line holder 16 comprises a snap holder 22 and a screw holder 24. The snap holder 22 is held by a hinge 26 and loaded by a spring 28. A seat 30 mounted on the hollow loop 12 holds the hinge 26. The screw holder 24 comprises a threaded rod 32. The threaded rod 32 is located in a threaded receptacle in the seat 30. A handle 34 for turning the threaded rod 32 and thereby either fixating or releasing the screw holder 24 is attached to the end of the threaded rod 32 facing away from the power line 18. A fixation plate 36 is attached to the end of the threaded rod 32 facing towards the power line 18. The fixation plate 36 provides a larger fixation area to fixate the cable in a secure position. The fixation plate may preferably be slightly undulated, corresponding to the outer surface of the power line 18. By turning the handle 34 clockwise, the power line 18 may be firmly fixated to the power line holder 16 and thereby the current measurement system 10. Consequently, by turning the handle 34 anticlockwise, the power line 18 may be released.

A Faraday optical current sensor 38 is located in a specific measurement position inside the hollow loop 12. The Faraday optical current sensor 38 comprises a small and elongated cylinder made of plastic material. The Faraday optical current sensor 38 has a size fitting inside the hollow loop 12. The specific measurement position is defined at a position juxtaposed the power line 18, perpendicular to the power line 18, such that the magnetic flux density in the direction of the light beam through the Faraday optical current sensor 38 is maximized. The Faraday optical current sensor 38 is fixated in the specific measurement position by a fixation part 40. The fixation part 40 comprises a flexible rod 42, a gripping member 44 and a base plate 46. The gripping member 44 is attached to the flexible rod 42 and comprises two claws clamping the Faraday optical current sensor 38 and holding it in a secure position juxtaposed the flexible rod 42. The flexible rod 42 is substantially straight in its relaxed state. By positioning the flexible rod 42 inside the hollow loop 12 the flexible rod 42 will assume a substantially bent state, thereby applying a friction force onto the inner wall of the hollow loop 12. The base plate 46 has a dimension larger than the inner diameter of the hollow loop 12 and will be located in a position inside the hollow cylindrical base 14 juxtaposed to the hollow loop 12. By placing the base plate 46 in the position juxtaposed to the hollow loop 12, the distance of the rod 42 will position the Faraday optical current sensor 38 in the measurement position. Alternatively, a small groove in the hollow cylindrical base 14 corresponding to the size of the base plate 46 may be used to fixate the base plate 46 in a specific position, thereby adding additional security for the measurement position. An optical conduit 48 is accommodated inside the hollow loop 12 for transmitting light to and from the Faraday optical current sensor 38. The optical conduit 48 is made of an optical fibre and encapsulated by a hose made of rubber, plastics or the like. The optical fibre has a limited flexibility and may break or be damaged when subject to a high bending force or curvature. The curvature of the hollow loop 12 should not extend the maximum allowed curvature of the optical conduit 48.

Figure 2:
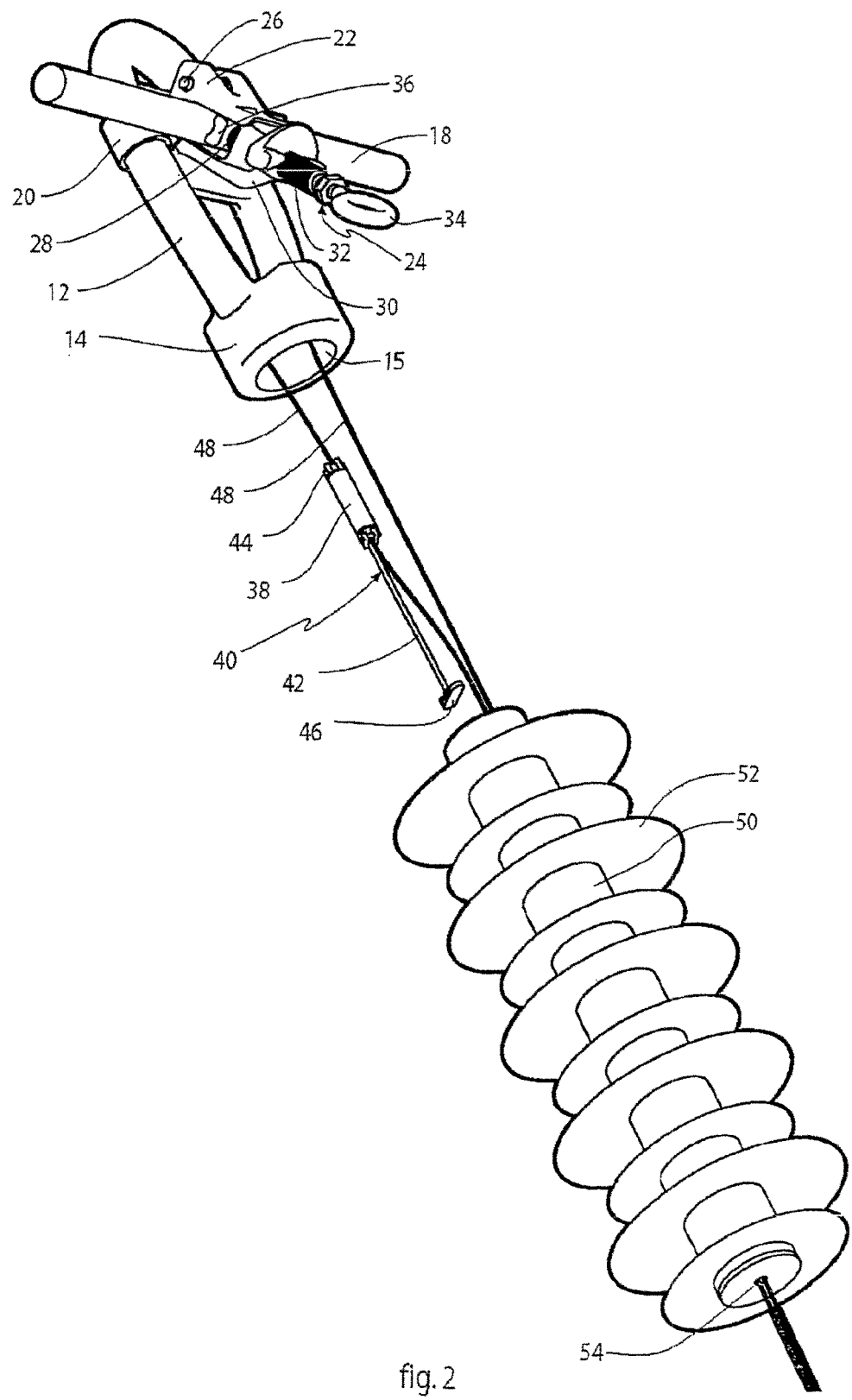
FIG. 2 is a perspective and schematic view illustrating in greater detail the technique of assembling the current measurement system shown in FIG. 1 and positioning the current measurement system relative to an insulator.

FIG. 2 shows the assembly of a current measurement system 10 including the Faraday optical current sensor 38, and a hollow insulator 50. The hollow insulator 50 is suitable for outdoor use and preferably made of composite materials. Alternatively a ceramic or glass insulator may be used. The hollow insulator 50 has a number of sheds 52 and a feed through channel 54 located centrally or alternatively off-centre. The number of sheds depends on the voltage level. The optical conduit 48 is fed through the feed through channel 54 through the elongation of the hollow insulator 50. Since the optical conduit 48 is made of dielectric materials, the dielectric properties of the hollow insulator 50 will not be influenced. The end of the insulator facing towards the power line 18 and the current measurement system 10 may be kept at high voltage potential. The end of the insulator 50 facing away from the power line 18 and the current measurement system 10 may be attached to, preferably hung from, e.g. the upper part of a high voltage tower (not shown) or the like having ground potential. The optical conduit 48 transmits the light from a light source (not shown) emitting linear polarized light of a specific wavelength to the Faraday optical current sensor 38. The Faraday optical current sensor 38 includes a magneto-optical part (not shown), which acts to rotate the polarisation of the light proportional to the current in the power line 18. The light propagates further via the optical conduit 48 to a receiver (not shown) evaluating the rotation of the polarized light. The rotation is used to calculate the current in the power line 18. The light source, receiver and other signal processing equipment may be installed at an arbitrary distance from the Faraday optical current sensor 38. The optical conduit 48 may further be divided into several optical conduits such as a bundle of optical fibres. However, it should be noted that the transition between materials of different optical properties might have influence on the wavelength and polarisation of the light.

The assembly above is mounted by first introducing one end of the optical conduit 48 into the circular opening 15. The optical conduit is fed into the hollow loop 12 and is guided inside the hollow loop 12 through the hollow loop 12 and exits again through the opening 15. The Faraday optical current sensor 38, being attached to the optical conduit 48, is then together with the fixation part 40 fixated in the measurement position. Finally, the optical conduit 48 is led through the hollow insulator 50 and the hollow cylindrical base 14 is fixated onto the hollow insulator 50. The hollow cylindrical base 14 and the hollow insulator 50 may be joined by a screw connection.

Figure 3B:
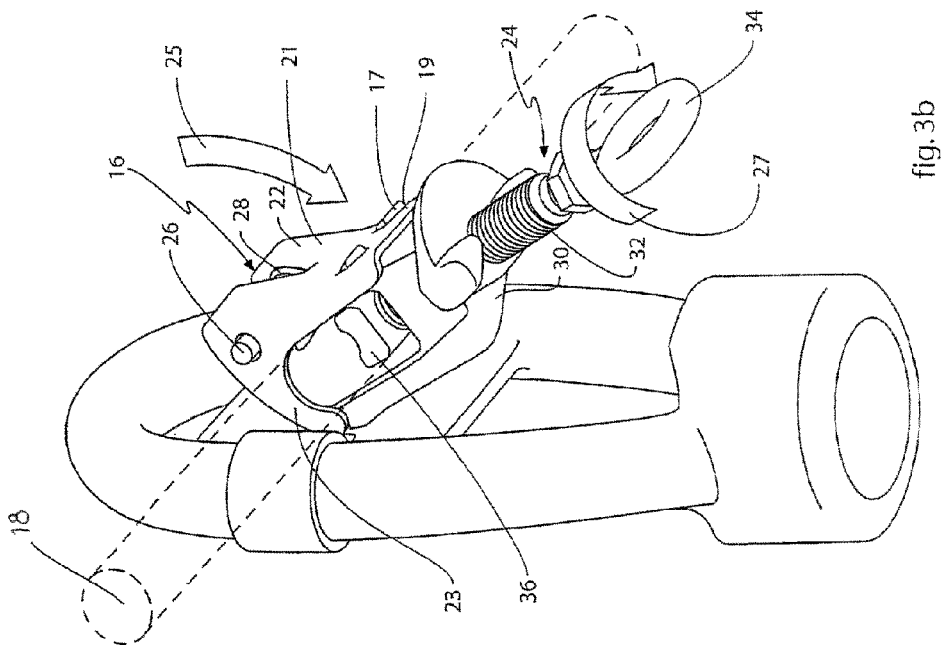
FIGS. 3a and 3b are overall perspective and schematic views similar to the view of FIG. 1 illustrating the technique of mounting an overhead power line relative to the current measurement system.
Figure 3A:
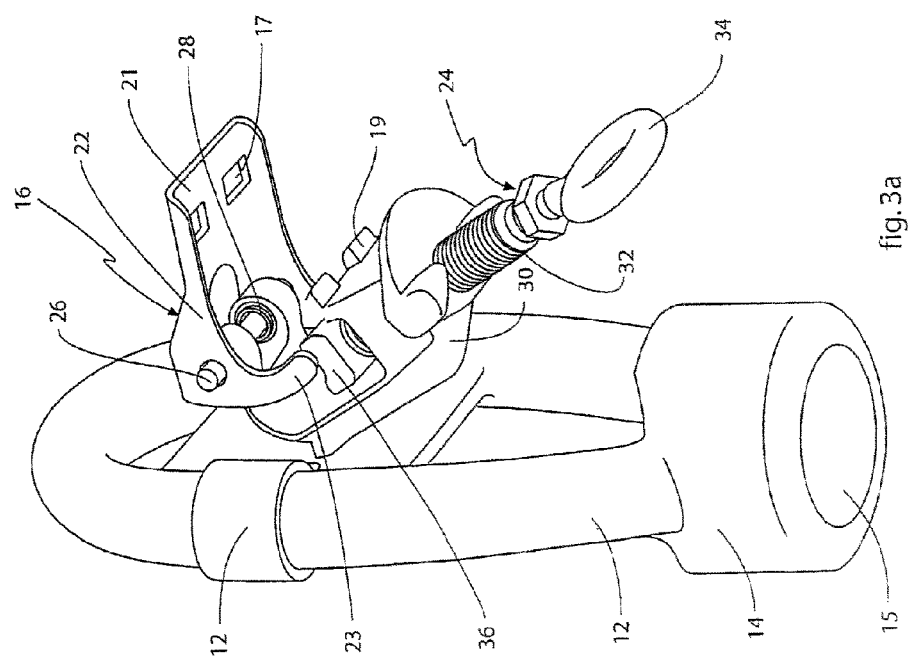

FIG. 3a shows the power line holder 16 in an open state without any power line 18 attached. The spring 28 causes the snap holder 22 to assume the open state by rotating the snap holder 22 in an outwards direction in relation to the seat 30. By rotating the handle 34, and thereby the threaded rod 32, in an anticlockwise direction, the screw holder 24 will as well assume an open state. The open state of both the snap holder 22 and the screw holder 24 is a prerequisite for enabling the insertion of the power line into the snap holder 22. The snap holder 22 is wider than the fixation plate 36, thereby allowing the snap holder 22 to rotate without influence from the screw holder and vice versa. The snap holder 22 comprises a locking plate 21 and a closing member 23 in a direction perpendicular to the locking plate. The locking plate 21 further comprises two locking holes 17 that receive two corresponding locking pins 19 on the seat 30.

FIG. 3b shows the power line holder 16 in a closed state with a power line 18 connected. When the power line 18 is inserted the closing member 23 is displaced. By inserting the power line 18 into the snap holder 22, the snap holder 22 is assuming a closed state in relation to the seat 30 by rotating around the hinge 26 in the direction indicated by the closing direction arrow 25. The locking plate 21 is thereby pressed against the seat 30 and the locking pin 19 is inserted into the locking hole 17 providing additional stability against forces in the direction of the power line 18. By rotating the handle 34, and thereby the threaded rod 32, in a clockwise direction 27, the screw holder 24 will as well assume a closed position. By closing the screw holder, i.e. by rotating the threaded rod 32 in a clockwise direction 25, the fixation plate 36 is pressed against the power line 18, which in turn is pressed against the seat 30 and the closing member 23 of the snap holder 22. At the same time the locking plate 21 of the snap holder 22 is pressed against the seat 30, providing a very secure fixation of the power line 18. The snap holder 22 and screw holder 24 work jointly. Both the snap holder 22 and the screw holder 24 must be closed for the power line 18 to be properly fixated. By opening the screw holder 24, i.e. rotating the handle in an anticlockwise direction, the snap holder will rotate around the hinge 26 in a direction opposite the direction indicated by the closing direction arrow 25 and assume an open position, thereby ejecting the power line from the snap holder 22. The anticlockwise direction above should be understood to mean the opposite direction of the clockwise direction 27.

Figure 4:
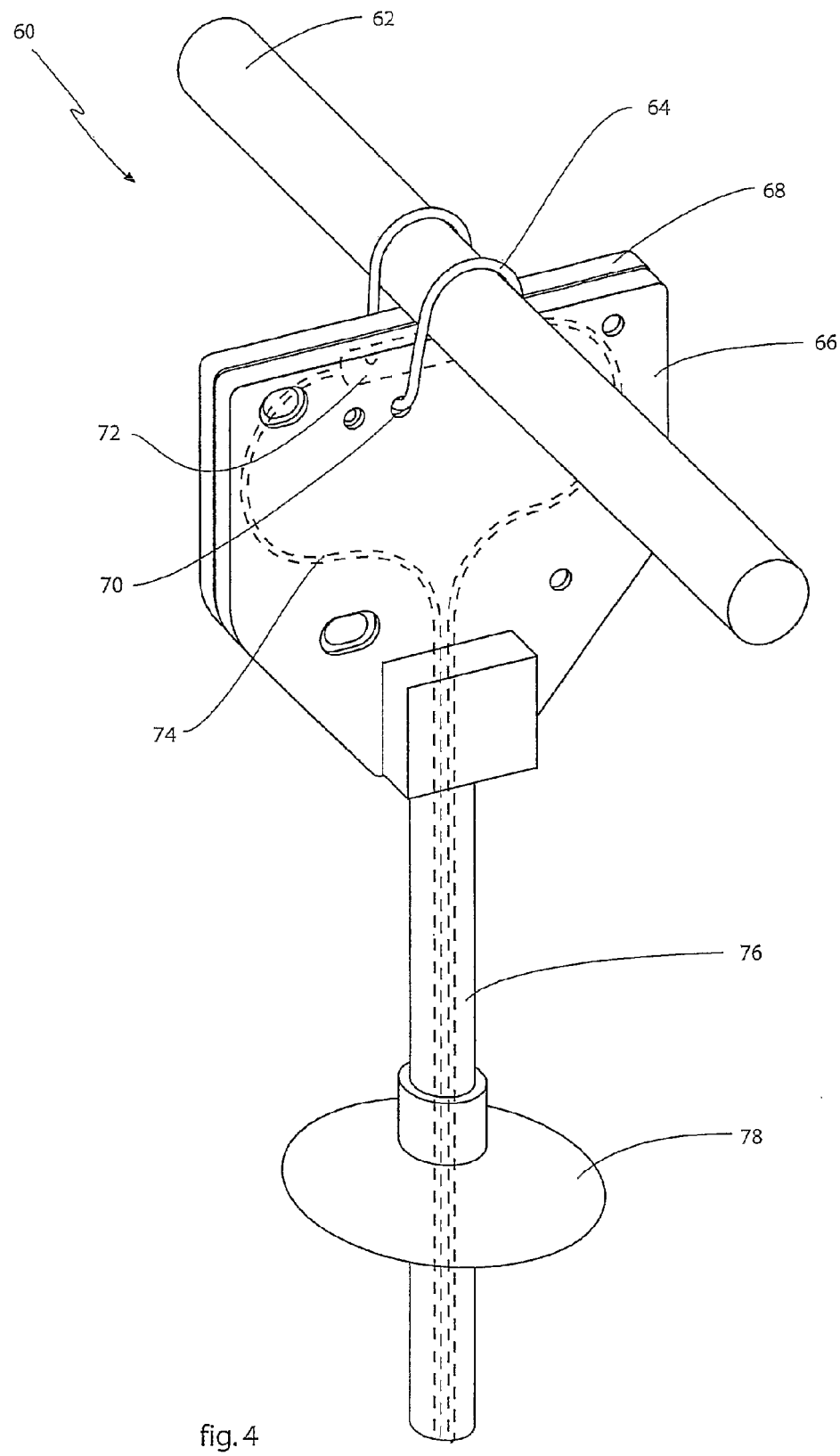
FIG. 4 is an overall perspective and schematic view of a second embodiment of a current measurement system according to the present invention.

FIG. 4 shows a second embodiment of a current measurement system 60 according to the present invention. The current measurement system 60 comprises a housing 66 which is fixated to a power line 62 by a holder band 64. The power line 62 may preferably be a high voltage overhead line. The housing 66 has a flat shape with a rectangular upper surface 68. The holder band 64 comprises a band of a flexible but solid and durable material such as metal or polymer. The holder band 64 fixates the housing 66 in a position such that the rectangular upper surface 68 extends substantially perpendicular in relation to the dimension of the power line 62. The holder band 64 encircles the power line 62 and engages the housing through a hole 70. The power line 62 is thereby permanently and securely fixated to the current measurement system 60. Alternatively, the holder band 64 may be shaped like a hook for facilitating the removal and the attachment of the current measurement system 60 to the power line 62 for a substantially mobile measurement system 60.

The current measurement system 60 further comprises an insulator 76 attached to the housing 66. The insulator 76 is made of any electrically insulating material such as glass, rubber or, preferably, plastics. The insulator 76 may be used as a handle for removing and attaching the current measurement system 60 to an electrified power line 62. Alternatively, the insulator 76 may be mounted on the ground or to a tower and be used for supporting the housing 66 and/or the power line 62. The insulator 76 may optionally comprise one or more sheds 78.

The housing 66 envelops a Faraday optical current sensor 72, which has an elongated cylindrical shape. The Faraday optical current sensor 72 is located in a position at the rectangular upper surface 68 juxtaposed to the power line 62. The Faraday optical current sensor 72 extends in the direction of the rectangular upper surface 68. The Faraday optical current sensor 72 is securely fixated in the measurement position by the housing 66. The housing also encapsulates an optical conduit 74 communicating with the Faraday optical current sensor 72. The optical conduit 74 enters and exits the housing 66 through the insulator 76. The housing 66 and the Faraday optical current sensor 72 should be made of a substantially magnetic transparent material so as not to influence the magnetic field generated by the power line 62. The optical conduit 74 should be made of dielectric material so as not to influence the dielectric properties of the insulator 76. The housing 66 and the Faraday optical current sensor 72 may be kept at high voltage potential and may preferably be made of dielectric material.

Figure 5:
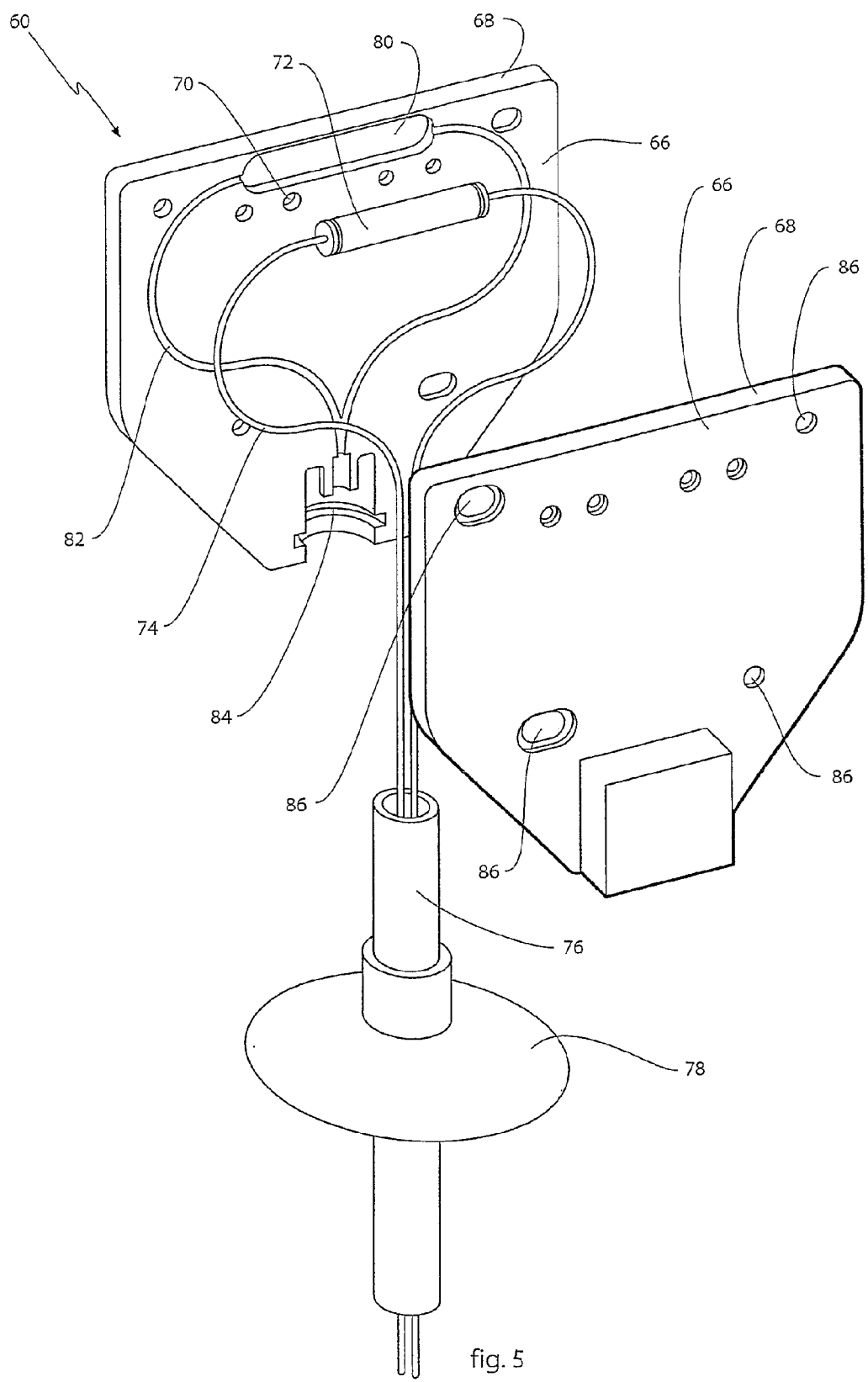
FIG. 5 is a perspective and schematic view of the second embodiment of the measurement system shown in FIG. 4 in a disassembled state.

FIG. 5 shows the inside of the housing 66. The housing 66 may be separated into two substantially equal parts. The inside of the housing 66 has a cylinder shaped groove 80 for accommodating the Faraday optical current sensor 72 and securely fixating the Faraday optical current sensor 72 in a measurement position. The groove 80 is located near the rectangular upper surface 68. Opposite the rectangular upper surface 68 the housing 66 has a joint 84 for attaching the insulator 76. A loop shaped groove 82 extend between the cylinder shaped groove 80 and the joint 84 for accommodating the optical conduit 74. To assemble the current measurement system 60, first the Faraday optical current sensor 72 is placed in the groove 80 and the optical conduit 74 is placed in the loop shaped groove 82 and fed through the insulator 76. Subsequently, both parts of the housing 66 are joined such that the insulator 76 is clamped at the joint 84. Inserting a screw in the fixation hole 86 securely closes the housing.

Figure 6:
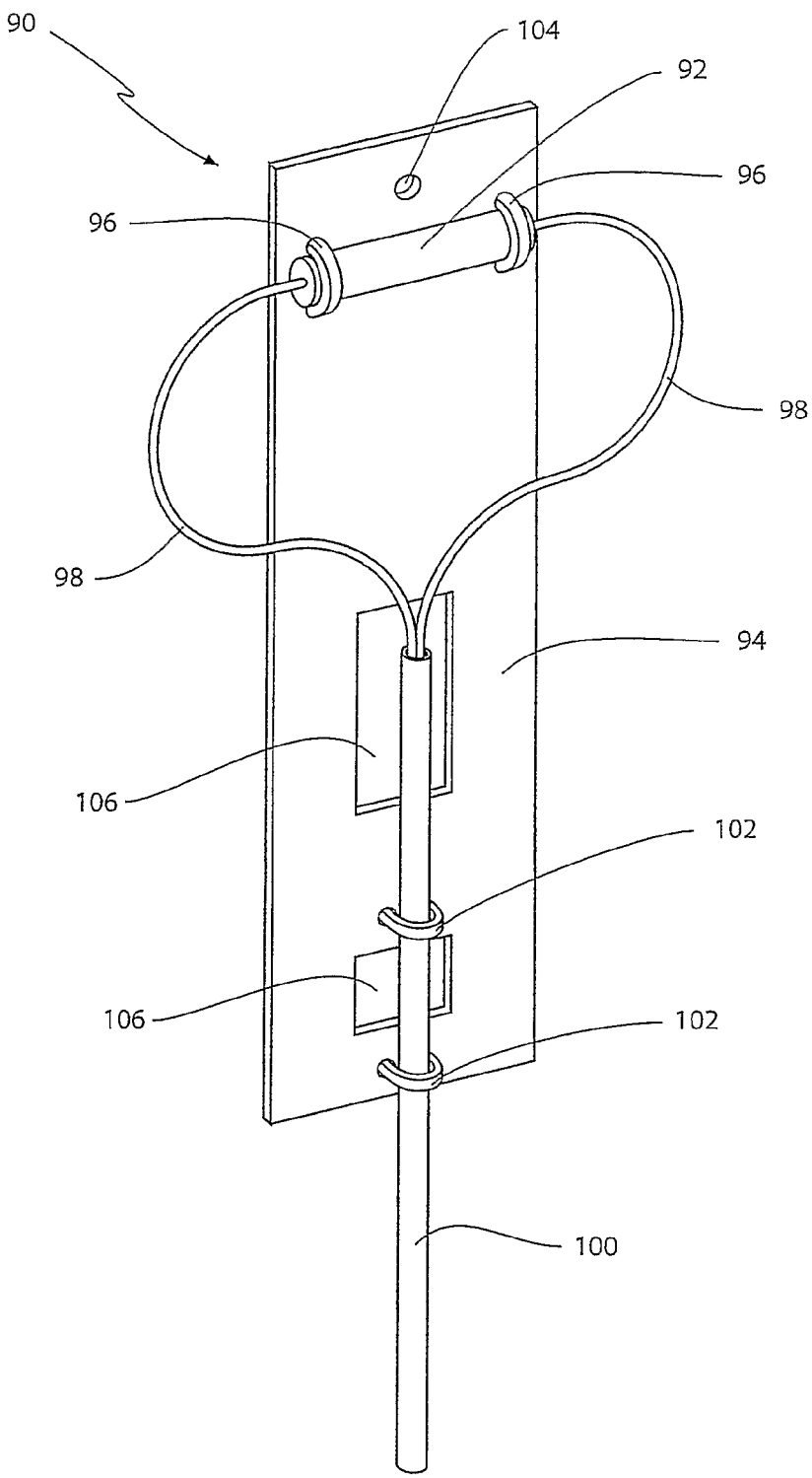
FIG. 6 is an overall perspective and schematic view of a third embodiment of the current measurement system according to the present invention.

FIG. 6 shows a third embodiment of a current measurement system 90 according to the present invention. The current measurement system 90 comprises a Faraday optical current sensor 92 fixated onto a support plate 94 by the use of two fixation bands 96. The support plate 94 and the fixation band 96 should be made of magnetically transparent material. An optical conduit 98 extends from each side of the Faraday optical current sensor 92. The optical conduit 98 forms a loop shape and both ends of the optical conduit 98 are fed into a guiding hose 100. The guiding hose 100 is fixated onto the support plate 94 by the use of two fixation bands 102.

The support plate 94 further defines a circular fixation hole 104. The circular fixation hole 104 is preferably used for fixating the support plate 94 to a power line (not shown) by means of a hook or band (not shown) in a substantially hanging vertical position in relation to the ground plane. The support plate 94 further defines two rectangular fixation holes 106 for fixating the support plate 94 to a power line (not shown) by means of a hook or band (not shown) in a substantially horizontal position in relation to the ground plane.

The first and second embodiments of the current measurement system are primarily suitable for outdoor applications and certain highly polluted indoor applications. The first and second embodiment may further be placed in a substantially hanging position supported by the power line, or preferably together with an insulator or the like be used as a supporting means themselves for supporting the power line. The third embodiment is primarily suitable for clean indoor applications such as substations and transformer stations. The third embodiment may either be hung onto a power line or, preferably, fixated onto a power line.

The term power line should in this context be understood to encompass any conductor and equipment for current conduction, such as e.g. overhead lines, cables or bus bars.

The term measurement position refers to a secure position suitable for optical current measurement in a nearby power line. The term secure should further be interpreted to mean that a certain amount of human interaction is necessary to disturb the measurement position to prevent involuntary disturbances.

High current and high voltage application in the above context should be understood to mean any application concerning electrical power generation, transmission or distribution and especially the voltage range 1 kV to 400 kV.

It is further evident that the above embodiments may be modified or combined to achieve numerous alternative embodiments of the Faraday optical current sensor arrangement according to the aspects of the present invention. For instance, the power line holder 16 of the first embodiment may be replaced by another arrangement fulfilling the same purpose, such as the holder band 64 of the second embodiment, and the insulator 50 of the first embodiment may be replaced by another insulator type, such as the simpler and lighter insulator 76 of the second embodiment.

LIST OF PARTS WITH REFERENCE TO THE FIGURES

10. Current measurement system (according to a first embodiment)
12. Hollow loop
14. Hollow cylindrical base
15. Circular opening
16. Power line holder
17. Locking hole
18. Power line
19. Locking pin
20. Spacer
21. Locking plate
22. Snap holder
23. Closing member
24. Screw holder
25. Closing direction arrow
26. Hinge
27. Clockwise direction arrow
28. Spring
30. Seat
32. Threaded rod
34. Handle
36. Fixation plate
38. Faraday optical current sensor
40. Fixation part
42. Flexible rod
44. Gripping member
46. Base plate
48. Optical conduit
50. Insulator
52. Sheds
54. Feed through channel
60. Current measurement system (according to a second embodiment)
62. Power line
64. Holder band
66. Housing
68. Rectangular upper surface
70. Fixation hole
72. Faraday optical current sensor
74. Optical conduit
76. Insulator
78. Shed
80. Groove
82. Loop shaped groove
84. Joint
86. Fixation hole
90. Current measurement system (according to a third embodiment)
92. Faraday optical current sensor
94. Support plate
96. Fixation band
98. Optical conduit
100. Guiding hose
102. Fixation band
104. Circular fixation hole
106. Rectangular fixation hole

The invention claimed is:

1. A Faraday optical current sensor arrangement for measuring electrical current through a conductor, the arrangement comprising:
   a Faraday optical current sensor having a first end and a second end opposite the first end;
   a first optical conduit extending from the first end and a second optical conduit extending from the second end;
   a housing enveloping the Faraday optical current sensor and fixing the Faraday optical current sensor in a specific measurement position relative to the housing, the housing defining a channel configured for accommodating the Faraday optical current sensor and the first and second optical conduits; and
   a holder attached to the housing and configured for fixing the conductor and the housing relative to one another in a juxtaposed position, thereby positioning the Faraday optical current sensor in a specific measuring position relative to the conductor.

2. A Faraday optical current sensor arrangement according to claim 1, wherein the housing comprises a hollow base part defining an inner space and a hollow loop-shaped part, the base part defining an opening for accessing the inner space of the base part, the hollow loop-shaped part defining the channel and having a primary end and a secondary end both communicating with the opening via the inner space of the base part.

3. A Faraday optical current sensor arrangement according to claim 1, further comprising a fastener configured for fastening the housing to an insulator.

4. A Faraday optical current sensor arrangement according to claim 1, wherein the holder includes a screw holder and a snap holder.

5. A method for assembling a Faraday optical current sensor arrangement for measuring electrical current through a conductor, the method comprising:
  (a) providing (i) a Faraday optical current sensor having a first end and a second end opposite the first end, (ii) a first optical conduit extending from the first end and a second optical conduit extending from the second end, (iii) a housing defining a channel, and (iv) a holder attached to the housing;
  (b) accommodating the Faraday optical current sensor and the first and second optical conduits in the channel;
  (c) fixing the Faraday optical current sensor in a specific measurement position relative to the housing; and
  (d) fixing the conductor in the holder in a juxtaposed position relative to the Faraday optical current sensor such that the Faraday optical current sensor is positioned in a specific measuring position relative to the conductor.

6. A Faraday optical current sensor arrangement for measuring electrical current through a conductor, said arrangement comprising:
  a Faraday optical current sensor having a first end and a second end opposite the first end;
  a first optical conduit extending from the first end and a second optical conduit extending from the second end; and
  a plate having a first holder for fixing the Faraday optical current sensor in a specific measurement position relative to the plate, and a second holder for fixing the first and second optical conduits to the plate, the plate defining a fixation hole configured for fixing the conductor and the plate relative to one another in a juxtaposed position, thereby positioning the Faraday optical current sensor in a specific measuring position relative to the conductor.

7. A method for assembling a Faraday optical current sensor arrangement for measuring electrical current through a conductor, the method comprising:
  (a) providing (i) a Faraday optical current sensor having a first end and a second end opposite the first end, (ii) a first optical conduit extending from the first end and a second optical conduit extending from the second end, and (iii) a plate having a first holder, a second holder, and a fixation hole;
  (b) fixing the Faraday optical current sensor in a specific measurement position relative to the plate by using the first holder;
  (c) fixing the first and second optical conduits to the plate by using the second holder; and
  (d) fixing the conductor and the plate relative to one another in a juxtaposed position such that the Faraday optical current sensor is positioned in a specific measuring position relative to the conductor by passing the conductor through the fixation hole.

8. A method of measuring electrical current in a conductor, comprising:
  (a) providing a Faraday optical current sensor arrangement comprising (i) a Faraday optical current sensor defining a first end and a second end opposite the first end, (ii) a first optical conduit extending from the first end and a second optical conduit extending from the second end, (iii) a housing enveloping the Faraday optical current sensor and fixing the Faraday optical current sensor in a specific measurement position relative to the housing, the housing defining a channel accommodating the Faraday optical current sensor and the first and second optical conduits, and (iv) a holder attached to the housing and configured for fixing the conductor and the housing relative to one another in a juxtaposed position, thereby positioning the Faraday optical current sensor in a specific measuring position relative to the conductor;
  (b) irradiating the first optical conduit with light having a specific wavelength and a specific first polarization;
  (c) determining a second polarization of light exiting the second conduit; and
  (d) calculating a current in the conductor by using the rotational difference between the first polarization and the second polarization.

\* \* \* \* \*